United States Patent [19]

Kawakami

[11] Patent Number: 4,768,005

[45] Date of Patent: Aug. 30, 1988

[54] CAPACITORLESS DC BIAS LINES FOR USE WITH R.F. SIGNAL PROCESSING APPARATUS

[75] Inventor: Kenneth N. Kawakami, Sunnyvale, Calif.

[73] Assignee: Microwave Technology, Inc., Fremont, Calif.

[21] Appl. No.: 30,206

[22] Filed: Mar. 25, 1987

[51] Int. Cl.[4] .......................... H01P 3/08; H03F 3/60

[52] U.S. Cl. .................................. 333/246; 330/286; 330/296

[58] Field of Search .................. 330/53, 57, 286, 287, 330/277, 296; 333/204, 205, 246, 247

[56] References Cited

U.S. PATENT DOCUMENTS 4,504,796 3/1985 Igarashi .............................. 330/286

OTHER PUBLICATIONS

Schwaderer et al., "Kettenverstärker mit bipolaren Siliziumtransistoren: 250 MHz bis 6 GHz", *Archiv für Elektrotechnik*, No. 3/4, Nov. 6, 1981, pp. 177–183.

*Primary Examiner*—James B. Mullins
*Attorney, Agent, or Firm*—Nathan N. Kallman; Alan H. MacPherson; Paul J. Winters

[57] ABSTRACT

A DC bias line module for use with an r.f. signal processing apparatus which incorporates terminating resistors, in lieu of capacitors, that are connected to the r.f. line.

7 Claims, 2 Drawing Sheets

CAPACITORLESS DC BIAS LINES FOR USE WITH R.F. SIGNAL PROCESSING APPARATUS

BACKGROUND OF THE INVENTION

1. Field of the Invention

This invention relates to an r.f. signal processing apparatus, and in particular to a capacitorless DC bias line module used in an r.f. signal processing apparatus.

2. Description of the Prior Art

DC bias line modules are generally employed with r.f. (radio frequency) signal processing equipment, such as microwave amplifiers, which is used to provide gain. Also DC bias is employed to compensate for temperature variations in an amplifier which is subject to temperature variations. In the past, DC bus lines or DC bias lines incorporated capacitors to prevent the DC bias lines from resonating by providing r.f. "shorts" periodically along the bus lines. The capacitors were spaced at distances not greater than one-half wave length at the highest operating frequency of the apparatus, as illustrated in FIG. 1. Each capacitor C is shown as having one plate connected to a junction between adjacent DC bias lines 10*a* . . . 10*n* and the other plate to a reference potential, such as ground. However, it is well known that capacitors are subject to failure which results in degraded reliability. Also, capacitors used with DC bus lines are relatively large and occupy too much space for systems that require compactness of design.

SUMMARY OF THE INVENTION

An object of this invention is to provide a DC bias line module in an r.f. signal processing apparatus that has improved reliability and occupies less space than previously known DC bias line modules.

In accordance with this invention, a capacitorless DC bias line module comprises an r.f. coupler that couples an r.f. signal to terminating resistors, thereby decreasing the Q of the resonance of the circuit so that the r.f. signal is not adversely affected. Q is defined as a measure of the ratio of the energy stored to the energy dissipated in equal intervals of time. To realize the desired r.f. coupling, the r.f. signal line is disposed closely adjacent to the DC bias line to provide optimum electromagnetic coupling to the DC bias line.

DESCRIPTION OF THE DRAWING

The invention will be disclosed in detail with reference to the drawing in which.

Similar numerals refer to similar elements throughout the drawing.

DETAILED DESCRIPTION OF THE INVENTION

Figure 1:
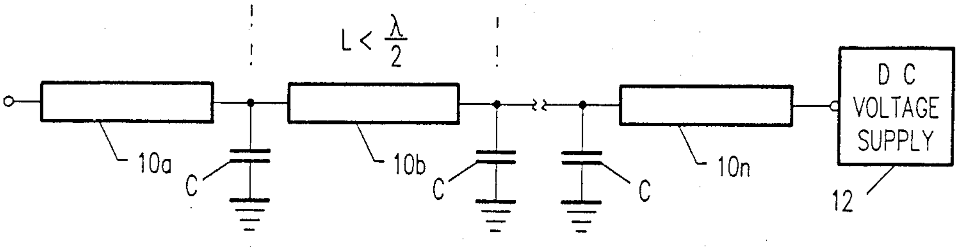
PRIOR ART FIG. 1
FIG. 1 is a representational view of a series of DC bias lines having capacitors connected thereto, in accordance with the prior art.

With reference to FIG. 1, a prior art DC bus line includes a plurality of DC bias modules 10*a* . . . 10*n* tied to a DC voltage supply 12. Capacitors C having a predetermined capacitive value based upon the operating parameters of the system are coupled between adjacent bias line modules and to ground potential. It is apparent that if any of the capacitors become inoperative, the operating performance of the r.f. signal processing system to which it is coupled would deteriorate.

Figure 2:
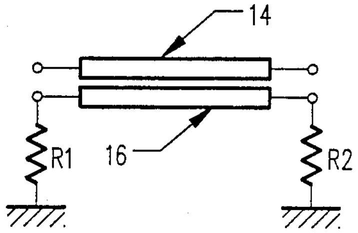
FIG. 2 is a schematic diagram representing the novel circuit of this invention.
Figure 3:
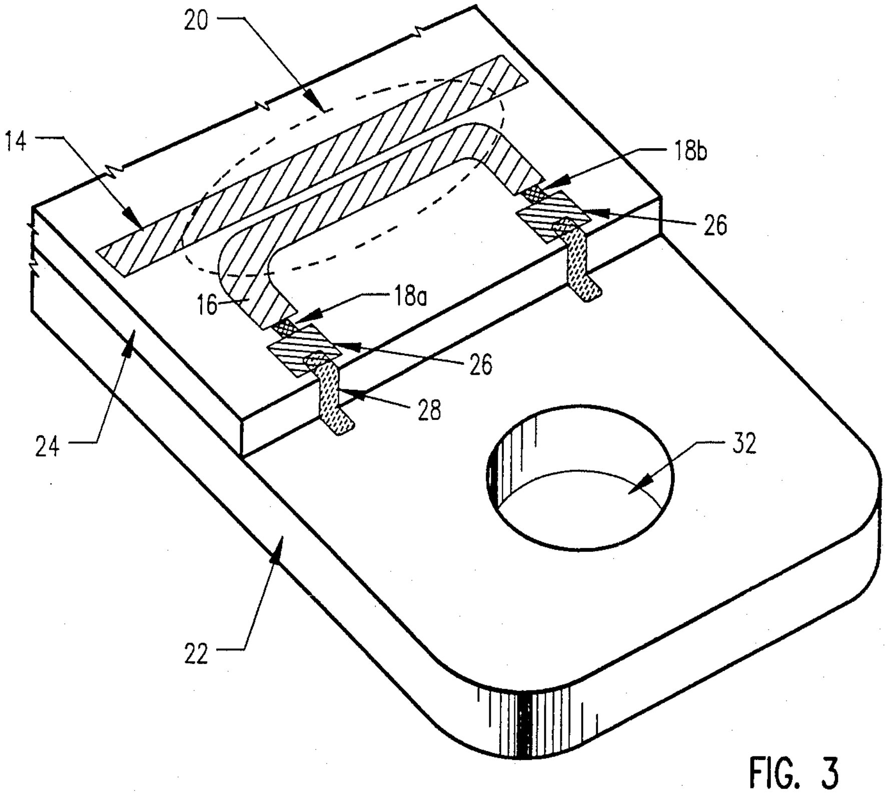
FIG. 3 is an isometric view of a DC bias line module, depicting the coupling of the bias line to a terminating resistor, in accordance with this invention.

To preclude the problem experienced with capacitors in an r.f. signal processing system, r.f. coupling is provided between the DC bias lines 14 and the r.f. line 16, in accordance with this invention. As shown in FIGS. 2 and 3, the coupled r.f. line 16 is tied to terminating resistors 18*a* and 18*b* which are preferably made of an r.f. absorbing thin film of TaN, each of which provides about 50 ohms of resistance. The coupled r.f. line 16 is spaced close to the DC bias line 14 so that an effective r.f. coupler region 20 (represented as a dashed line ellipse) is established.

In an implementation of this invention, a DC bias line module 10 includes a carrier 22, made of nickel/gold plated Kovar on which an $Al_2O_3$ (alumina) substrate 24 is brazed. The gold-backed alumina substrate is attached onto the gold-plated carrier 22 by AuGe or AuSi eutectic brazing or by conductive epoxy. A longitudinal thin film of TiW/Au and a C-shaped thin film of the same material are deposited with the gold exposed to form respectively the DC bus line 14 and coupled r.f. line 16 on the surface of the substrate. The longitudinal portion of the C-shaped r.f. line 16 is spaced close to the DC bus line 14 so that the DC signal is electromagnetically coupled to the r.f. signal within the r.f. coupler region.

In keeping with this invention, terminating resistors 18*a* and 18*b* formed from thin films are deposited in conductive connection to the ends of the C-shaped r.f. line. The thin film resistors each may have a resistive value of about 50 ohms, by way of example. A thin film bonding pad 26 of TiW/Au is also laid down, preferably during the same deposition process during which the DC bus line and the coupled r.f. line are formed. A thin film of gold ribbon 28 is bonded between the bonding pad 26 and the gold plated carrier 22 to provide a grounding function.

Figure 4:
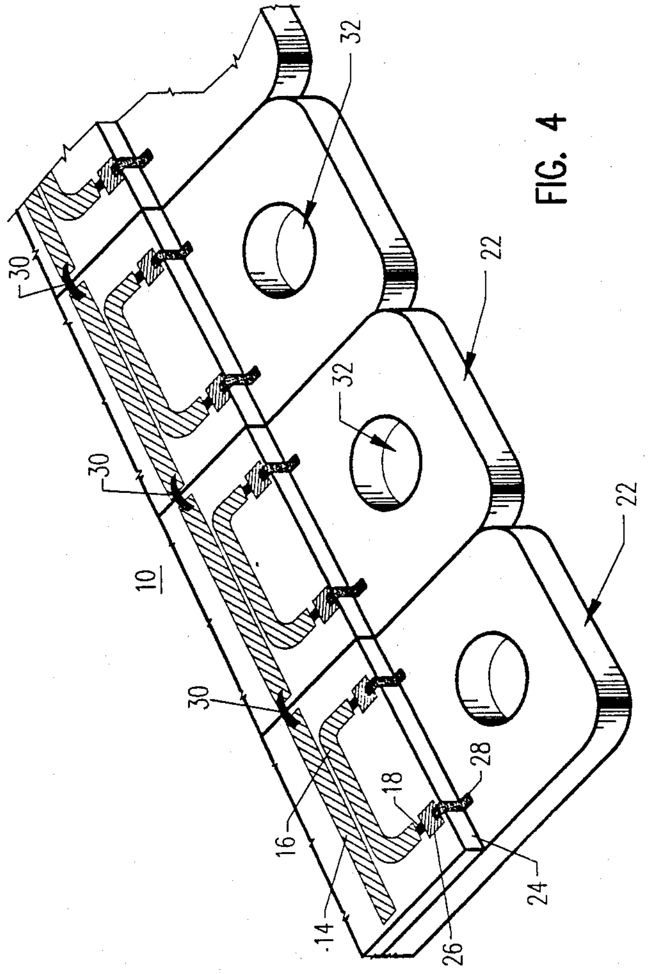
FIG. 4 depicts a series of DC bias line modules connected in series for operation with an r.f. circuit.

As illustrated in FIG. 4, the DC bias lines are serially connected by conductive leads 30, which may be made of gold ribbon or gold wire. The modules 10 have apertures 32 to allow the attachment of a series of connected modules 10 to be screwed down and joined to a support (not shown) in a serial array.

In a specific implementation of this invention, the coupler region length was approximately 0.125 inch with a gap of approximately 0.001 inch between the DC bus line and the coupled r.f. line; and the width of the bias lines and r.f. line conductors is about 0.015 inch. The thin film patterns are produced by the wet etch method, as known in the art.

By virtue of the use of terminating resistors instead of capacitors as disclosed herein, a more reliable and more compact modular construction of a DC bus line assembly is provided for an r.f. signal processing system.

It should be understood that the invention is not limited to the specific materials or parameters set forth above, which may be modified within the scope of the invention.

What is claimed is:

1. A capacitorless DC bias line module for use with an r.f. signal processing system comprising:

a DC bus line to which direct current only is applied;

an r.f. line coupled electromagnetically to said DC bus line; and terminating resistor means connected directly to said r.f. line and to ground, said module being structured without capacitors.

2. A DC bias line module as in claim 1, wherein said DC bus line and said r.f. line are formed from a thin film of TiW/Au.

3. A DC bias line module as in claim 1, including an electrically conductive carrier;

an insulating substrate supported by said carrier;

wherein said DC, bus line and r.f. line are formed on said substrate.

4. A DC bias line module as in claim 3, wherein said carrier is made of nickel/gold plated Kovar material, and said substrate is made of alumina.

5. A DC bias line module as in claim 1, wherein said resistor means are formed from a thin film.

6. A DC bias line module as in claim 1, wherein said resistor means comprises two terminating resistors, each having a resistance of about 50 ohms.

7. Apparatus for use with an r.f. signal processing system comprising:

a plurality of DC bias line modules structured without capacitors, each module comprising a DC bias line, an r.f. line coupled electromagnetically to said DC bias line;

each r.f. line of said plurality of modules having terminating resistors connected between said r.f. line and a source of reference potential;

conductive leads connecting said DC bias line in series; and aperture means formed in said modules for attaching said plurality of modules in an array.

* * * * *